(12) United States Patent
Van Der Schaar et al.

(10) Patent No.: US 7,391,513 B2
(45) Date of Patent: Jun. 24, 2008

(54) LITHOGRAPHIC APPARATUS AND DEVICE MANUFACTURING METHOD USING OVERLAY MEASUREMENT QUALITY INDICATION

(75) Inventors: Maurits Van Der Schaar, Veldhoven (NL); Arie Jeffrey Den Boef, Waalre (NL); Everhardus Cornelis Mos, Best (NL); Stefan Carolus Jacobus Antonius Keij, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 310 days.

(21) Appl. No.: 11/391,690

(22) Filed: Mar. 29, 2006

(65) Prior Publication Data

US 2007/0229837 A1  Oct. 4, 2007

(51) Int. Cl.
*G01B 11/00* (2006.01)
*G06K 9/00* (2006.01)

(52) U.S. Cl. ......................................... 356/401; 382/151
(58) Field of Classification Search ....................... None
See application file for complete search history.

(56) References Cited

U.S. PATENT DOCUMENTS

| | | | | |
|---|---|---|---|---|
| 4,703,434 A * | 10/1987 | Brunner | ....................... | 716/21 |
| 5,703,692 A | 12/1997 | McNeil et al. | .............. | 356/445 |
| 5,880,838 A | 3/1999 | Marx et al. | .................. | 356/351 |
| 5,963,329 A | 10/1999 | Conrad et al. | ................ | 356/372 |
| 6,608,690 B2 | 8/2003 | Niu et al. | .................... | 356/635 |
| 6,699,624 B2 | 3/2004 | Niu et al. | ........................ | 430/5 |
| 6,704,661 B1 | 3/2004 | Opsal et al. | .................... | 702/27 |
| 6,721,691 B2 | 4/2004 | Bao et al. | .................... | 702/189 |
| 6,738,138 B2 | 5/2004 | Wei | ............................ | 356/369 |
| 6,753,961 B1 | 6/2004 | Norton et al. | ............... | 356/364 |
| 6,768,983 B1 | 7/2004 | Jakatdar et al. | ............... | 706/46 |
| 6,772,084 B2 | 8/2004 | Bischoff et al. | ............. | 702/127 |
| 6,785,638 B2 | 8/2004 | Niu et al. | ..................... | 702/189 |
| 6,813,034 B2 | 11/2004 | Rosencwaig et al. | ........ | 356/601 |
| 6,819,426 B2 | 11/2004 | Sezginer et al. | ............. | 356/401 |
| 6,856,408 B2 | 2/2005 | Raymond | ................... | 356/601 |
| 6,919,964 B2 | 7/2005 | Chu | ........................... | 356/601 |
| 6,928,628 B2 | 8/2005 | Seligson et al. | ................ | 716/4 |
| 6,937,337 B2 * | 8/2005 | Ausschnitt et al. | .......... | 356/401 |
| 6,972,852 B2 | 12/2005 | Opsal et al. | .................. | 356/625 |
| 6,974,962 B2 | 12/2005 | Brill et al. | .................... | 250/548 |
| 6,987,572 B2 | 1/2006 | Lakkapragada et al. | ..... | 356/601 |
| 7,046,376 B2 | 5/2006 | Sezginer | ..................... | 356/601 |
| 7,061,615 B1 | 6/2006 | Lowe-Webb | ................ | 356/401 |
| 7,061,623 B2 | 6/2006 | Davidson | .................... | 356/497 |
| 7,061,627 B2 | 6/2006 | Opsal et al. | ................. | 356/601 |

(Continued)

*Primary Examiner*—Gregory J. Toatley, Jr.
*Assistant Examiner*—Gordon J Stock, Jr.
(74) *Attorney, Agent, or Firm*—Pillsbury Winthrop Shaw Pittman, LLP

(57) ABSTRACT

A lithographic apparatus arranged to transfer a pattern from a patterning device onto a substrate includes two reference gratings provided in the substrate and two measurement gratings on top of the reference gratings, the measurement gratings being similar to the reference gratings, and oppositely biased in a single direction relative to the respective reference gratings. An overlay measurement device with an image sensor is used for obtaining pixel data of a measurement spot in each of the two measurement gratings. Asymmetry for each pixel in the measurement spot is measured, and from the pixel asymmetry measurements in associated pixels of each of the two measurement gratings an overlay value and a process dependent value is determined, as well as a quality indicator for the overlay value and the process dependent value.

15 Claims, 3 Drawing Sheets

U.S. PATENT DOCUMENTS

| | | | |
|---|---|---|---|
| 7,068,363 B2 | 6/2006 | Bevis et al. | 356/237.5 |
| 2004/0119970 A1 | 6/2004 | Dusa et al. | 356/237.1 |
| 2006/0033921 A1 | 2/2006 | Den Boef et al. | 356/446 |
| 2006/0126074 A1 | 6/2006 | Van Der Werf et al. | 356/489 |
| 2006/0139592 A1 | 6/2006 | Den Boef et al. | 355/53 |

* cited by examiner

LITHOGRAPHIC APPARATUS AND DEVICE MANUFACTURING METHOD USING OVERLAY MEASUREMENT QUALITY INDICATION

FIELD OF THE INVENTION

The present invention relates to a lithographic apparatus and a method for manufacturing a device in which overlay is measured.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a manufacturing process using a lithographic projection apparatus, a pattern (e.g. in a mask) is imaged onto a substrate that is at least partially covered by a layer of radiation-sensitive material (resist) by the changes of either optical properties or surface physical properties of the resist. Alternatively, the imaging may use a resistless process such as etched grating or nano-imprint technology. Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

The measurement and inspection after development of the resist (or substrate surface in the case of etching), referred to as in-line because it is carried out in the normal course of processing production substrates, may be used to measure overlay between two sequential processes in the lithography apparatus using measurement targets in the scribelanes between the devices. Several methods may be used and may include measurement of overlay subsequently in two (perpendicular) directions on the substrate surface, or direct measurement using a complex two dimensional measurement target.

SUMMARY OF THE INVENTION

It is desirable to provide an overlay measurement method for a lithographic, apparatus in which the measurement method also provides an indication of the quality or reliability of the measurement, besides the quantitative value of the measured overlay.

According to an embodiment of the invention, there is provided a lithographic apparatus arranged to transfer a pattern from a patterning device onto a substrate, wherein the lithographic apparatus is configured to provide two reference gratings in the substrate and two measurement gratings on top of the reference gratings, the measurement gratings being similar to the reference gratings, and oppositely biased in a single direction relative to the respective reference gratings, and wherein the lithographic apparatus includes an overlay measurement device, the overlay measurement device including an image sensor for obtaining pixel data of a measurement spot in each of the two measurement gratings, and being configured to measure asymmetry for each pixel in the measurement spot, and to determine from the pixel asymmetry measurements in associated pixels of each of the two measurement gratings an overlay value and a process dependent value, and a quality indicator for the overlay value and the process dependent value.

According to an embodiment of the invention, there is provided a device manufacturing method including transferring a pattern from a patterning device onto a substrate, including providing two reference gratings in the substrate and two measurement gratings on top of the reference gratings, the measurement gratings being similar to the reference gratings, and oppositely biased in a single direction relative to the respective reference gratings, obtaining pixel data of a measurement spot in each of the two measurement gratings, measuring asymmetry for each pixel in the measurement spot, and determining from the pixel asymmetry measurements in associated pixels of each of the two measurement gratings an overlay value and a process dependent value, and a quality indicator for the overlay value and the process dependent value.

According to an embodiment of the invention, there is provided a device manufactured according to a method embodiment of the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
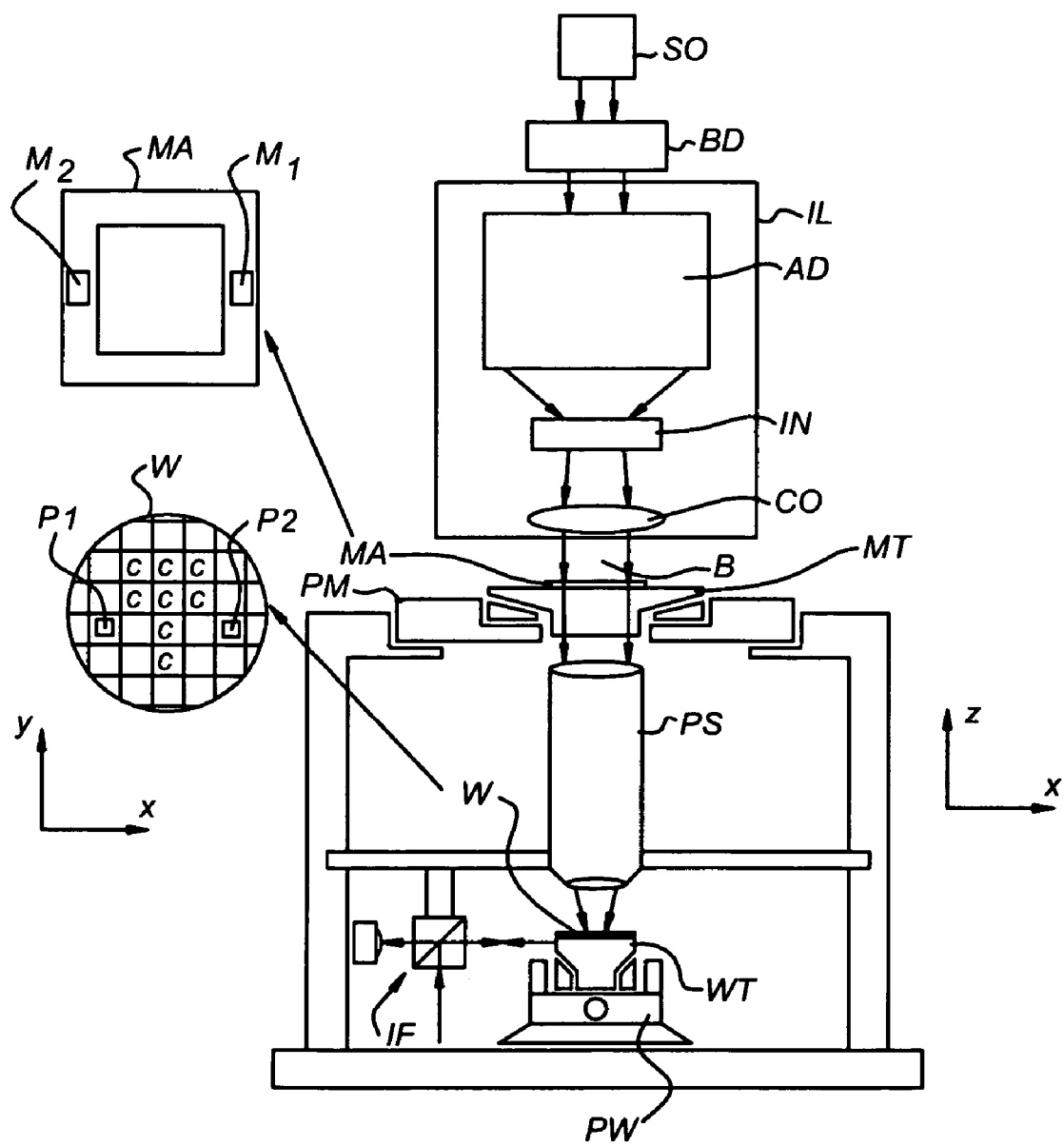
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribelane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
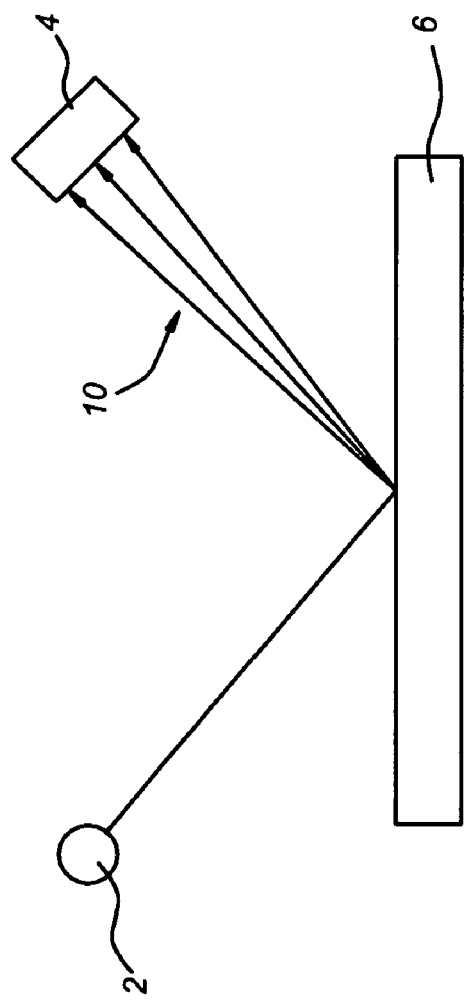
FIG. 2 depicts a scatterometry arrangement which may be used to measure asymmetry according to an embodiment of the present invention.

One or more properties of the surface of a substrate 6 may be determined using a scatterometer arrangement such as that depicted in FIG. 2. The scatterometer may includes a broadband (white light) radiation source 2, which directs radiation onto a substrate 6. An extended broadband radiation source may be configured to provide the radiation beam with a wavelength of at least 50 nm to the substrate surface. The reflected radiation is passed to a spectrometer detector 4, which measures a spectrum 10 (intensity as a function of wavelength) of the specular reflected radiation.

The scatterometer may be a normal-incidence scatterometer or an oblique incidence scatterometer. Variants of scatterometry may also be used in which the reflection is measured at a range of angles of a single wavelength, rather than the reflection at a single angle of a range of wavelengths.

Figure 3:
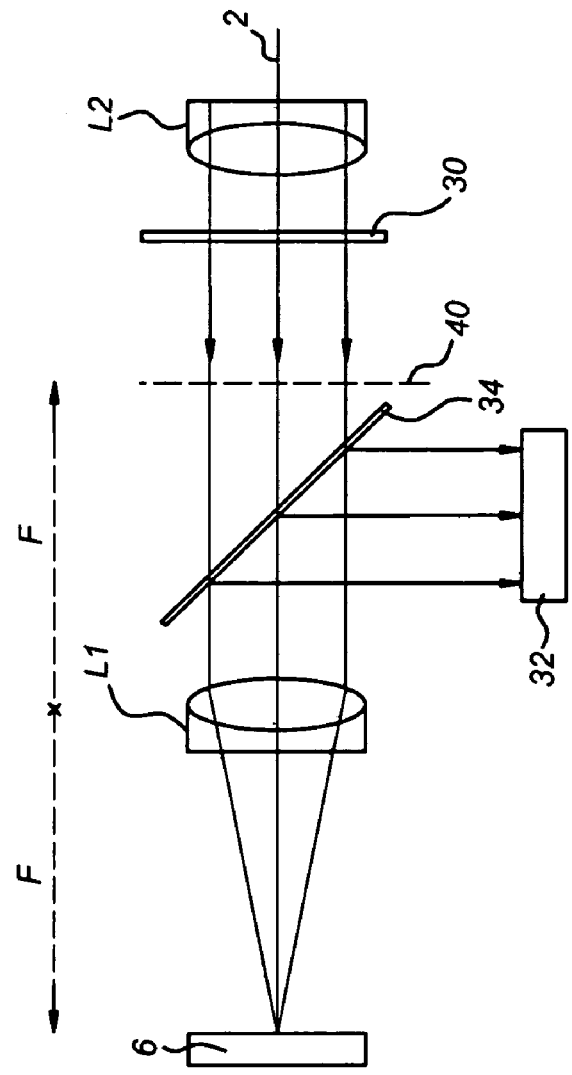
FIG. 3 depicts a scatterometry arrangement which may be used in a lithographic apparatus according to an embodiment of the present invention.

In one or more embodiments described below, there is used a scatterometer configured to measure a property of a substrate 6 by measuring, in a pupil plane 40 of a high NA lens, a property of an angle-resolved spectrum reflected from the substrate surface 6 at a plurality of angles and wavelengths as shown in FIG. 3. The scatterometer includes a radiation source 2 configured to project radiation onto the substrate and a detector 32 configured to detect the reflected spectra. The pupil plane is the plane in which the radial position of radiation defines the angle of incidence and the angular position defines the azimuth angle of the radiation and any substantially conjugate plane. The detector 32 is placed in the pupil plane of the high NA lens. The NA is high and, in an embodiment, at least 0.9 or at least 0.95. Immersion scatterometers may even have lenses with an NA over 1.

Previous angle-resolved scatterometers have only measured the intensity of scattered light. An embodiment of the present invention allows several wavelengths to be measured simultaneously at a range of angles. The properties measured by the scatterometer for different wavelengths and angles may include the intensity of transverse magnetic (TM) and transverse electric (TE) polarized light and the phase difference between the TM and TE polarized light.

The light source 2 is focused using lens system L2 through interference filter 30 and is focused onto substrate 6 via a microscope objective lens L1. The radiation is then reflected via partially reflective surface 34 into a CCD detector 32 in the back projected pupil plane 40 in order to have the scatter spectrum detected. The pupil plane 40 is at the focal length F of the lens system L1. A detector and high NA lens are placed at the pupil plane. The pupil plane may be re-imaged with auxiliary optics since the pupil plane of a high NA lens is usually located inside the lens.

The pupil plane of the reflector light is imaged on the CCD detector 32 with an integration time of, for example, 40 milliseconds per frame. In this way, a two-dimensional angular scatter spectrum of the substrate target 6 is imaged on the detector 32. The detector 32 may be an array of CCD detectors or CMOS detectors. The processing of the spectrum gives a symmetrical detection configuration and so sensors can be made rotationally symmetrical. This allows the use of a compact substrate table because a target on the substrate 6 can be measured at any rotational orientation relative to the sensor. All the targets on the substrate 6 can be measured by a combination of a translation and a rotation of the substrate 6.

A set of interference filters 30 may be available to select a wavelength of interest in the range of, say, 405-790 nm or even lower, such as 200-300 nm. The interference filter may be tunable rather than including a set of different filters. A grating could be used instead of one or more interference filters.

The substrate 6 (or even the reflective surface 34) may be a grating. The grating may be printed such that after development, a series of bars are formed of solid resist lines. The bars may alternatively be etched into the substrate. This pattern is sensitive to comatic aberrations in a lithographic projection apparatus, particularly the projection system PS, and illumination symmetry and the presence of such aberrations will manifest themselves in a variation in the printed grating. Accordingly, the scatterometry data of the printed gratings is used to reconstruct the gratings. One or more parameters of the grating, such as line widths and shapes, may be input to the reconstruction process from knowledge of the printing process and/or other scatterometry processes.

The scatterometer may be used to detect the spectrum and create a symmetrical pupil plane image from which the discontinuities can be measured and one or more grating properties therefore calculated.

The scatterometer may be adapted to measure the overlay of two misaligned periodic structures by measuring asymmetry in the reflected spectrum, the asymmetry being related to the extent of the overlay. The scatterometer may be adapted to measure the overlay of two misaligned gratings or periodic structures by measuring asymmetry in the reflected spectrum and/or the detection configuration, the asymmetry being related to the extent of the overlay. Thanks to the symmetrical detection configuration, any asymmetry is clearly distinguishable. This provides a straightforward way to measure misalignment in the gratings.

Figure 4:
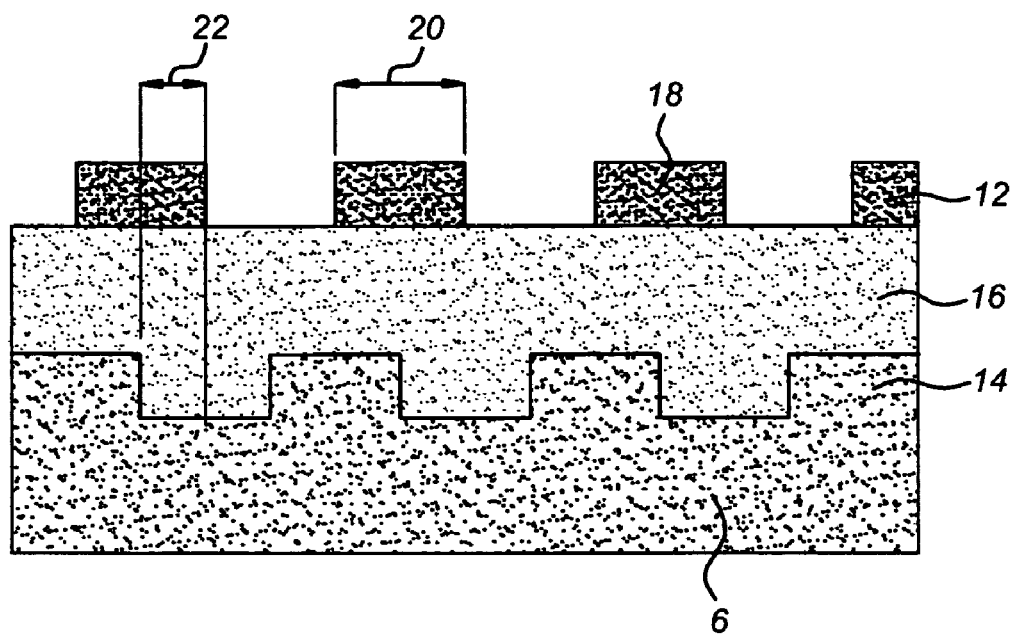
FIG. 4 depicts a sectional view of a reference grating and a measurement grating in a substrate applied in a method of the present invention.

One type of substrate pattern used is shown in FIG. 4. A reference grating 14 has a measurement grating 12 printed on top of it (or on top of a dielectric layer 16 which is made on top of the grating 14). The amount by which the measurement grating 12 is offset with respect to the reference grating 14 is known as the overlay 22, as indicated in FIG. 4.

Note that the radiation source 2 may illuminate the object symmetrically with respect to the surface normal and the scatterometry detector measures scatter radiation from several angles, although a source 2 which illuminates the object from an oblique angle is also possible.

Overlay metrology is based on the measurement of an asymmetry in the angular scatter spectrum. Symmetric structures yield symmetric angular spectra and an asymmetry in the target shows up as an asymmetry in the angular scatter spectrum. This property is the basis of overlay metrology using angle-resolved scatterometry.

Two overlapping but misaligned gratings (measurement grating 12 and reference grating 14) made of bars (or line elements) 18 with a width 20 (see FIG. 4) form one composite asymmetric target. The resulting asymmetry in the angular scatter spectrum is detected with the angle-resolved scatterometer 4 shown in FIG. 3 and used to derive the overlay 22 in the following manner:

Two grating pairs (each having a measurement grating 12 and a reference grating 14 on top of each other) are used with a deliberate bias of +d and −d in, respectively, the first and second pair, each thus forming a composite asymmetric target. In other words, measurement grating 12 is shifted in one direction in one pair and in the opposite direction in the other pair.

Figure 5:
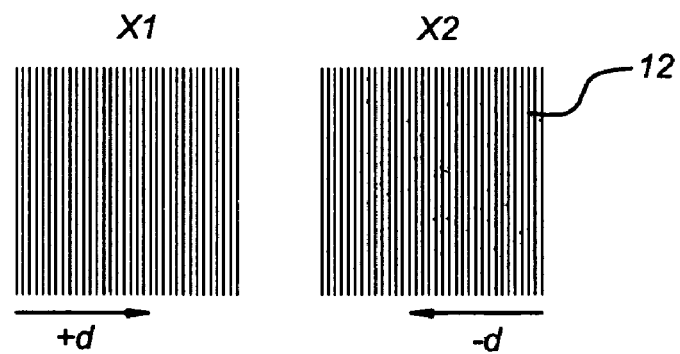
FIG. 5 depicts a top view of a set of measurement gratings as used in a method of the present invention.

Such an embodiment of composite asymmetric targets is shown in FIG. 5, in which the measurement gratings labeled X1 and X2 are shifted over a distance +d and −d, respectively.

The actual transverse shift between the gratings in each pair is therefore $X_1 = OV+d$ and $X_2 = OV-d$, OV being the overlay 22. When the grating pairs are aligned, the overlay is 0 and if the intensity of the illumination incident on the gratings is $I_{ill}$ and the intensity of the radiation reflected off the gratings is $I_{+1}$ in a first direction and $I_{-1}$ in the opposite direction but in the same plane, then when the overlay, OV=0, $I_{+1} = I_{-1}$. However, if $OV \neq 0$, $I_{+1} \neq I_{-1}$.

For a small overlay, the intensity difference is proportional to the overlay: $I_{+1} - I_{-1} = K \times OV$ (1), where K is a constant and is process dependent and therefore unknown.

Even if the intensity difference versus overlay is not a linear relation, but, for example, a sinusoidal type of relationship, for small asymmetries such a non-linear relationship may be approximated by a linear relationship as described in equation (1).

In order to calibrate the overlay metrology with the scatterometer, two grating targets are used as discussed above. Therefore, for OV+d, the measured asymmetry, $A_+ = K(OV+d)$ (2a) and for OV−d, the measured asymmetry, $A_- = K(OV-d)$ (2b).

According to an embodiment of the present invention, not only the overlay may be derived from these asymmetry measurements, but also a quality indicator related to that measurement. As described above, the asymmetry measurement is performed using a detector 32, such as a CCD sensor, which senses the reflected energy from a measurement spot on the measurement grating 12. The measurement spot may be of a smaller dimension than the reference grating 12 (thus filling all of the field of view of detector 32 with reflected energy), or the measurement spot may be larger, e.g. coinciding with the entire area of measurement grating 12 (thus showing the entire measurement grating 12 in the field of view of detector 32).

When the measurement spot is used for the same part of the two gratings X1 and X2, the asymmetry as defined above in equations 2a and 2b also applies to each individual pixel in the spot. From the two measurement gratings 12 with the same but opposite known bias d, then for each pixel, K and OV may be calculated in the first order spot. As a result, the distribution of OV and K values per pixel may be determined over the entire field of view of the detector 32.

The overlay measurements may be executed using an overlay measurement device having a scatterometer for detecting a reflected spectrum as described above. The overlay measurement device may further be configured to perform statistic operations on the distribution of OV and K values. For example, the spread of overlay values (sigma, or σ) may be calculated. When the spread σ of OV values is small, it may be assumed that the mean values of all OV values has a good quality, and is reliable.

In a further embodiment, multiple measurements are executed for different target locations on the substrate 6. Statistical calculations can again be performed for each target, or for the ensemble of measurement values of the entire substrate 6.

The statistical calculations may also be performed for the K value. The results thereof give a good indication of quality of the lithographic process.

The distance d (bias offset for the measurement gratings 12, X1 and X2 in FIG. 5) is smaller than the pitch distance of the grating lines 18 (or period of the grating lines 18), in order to allow a direct and unambiguous measurement of the asymmetry. For a pitch distance of, for example, 500 nm, the bias distance may be 10 nm.

In the FIG. 5 embodiment, the measurement gratings X1 and X2 are biased towards each other, but it is also possible to apply the bias to the gratings in the outward direction, as long as the bias is oppositely directed.

The arrangement of two gratings (both for the reference gratings 14 and the measurement gratings 12) according to the present invention is applied in the scribelane space of the substrate 6. In a finished wafer, and even in the edge area of finished dies, these arrangements are still present and visible. Thus the use of the present method is also visible in a device manufactured according to embodiments of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it should be appreciated that modifications may be made to the invention as described without departing from the scope of the claims set out below.

What is claimed is:

1. A lithographic apparatus arranged to transfer a pattern from a patterning device onto a substrate, wherein the lithographic apparatus is configured to provide two reference gratings in the substrate and two measurement gratings on top of the reference gratings, the measurement gratings being similar to the reference gratings, and oppositely biased in a single direction relative to the respective reference gratings, wherein the lithographic apparatus comprises an overlay measurement device, the overlay measurement device comprising an image sensor for obtaining pixel data of a measurement spot in each of the two measurement gratings, and being configured to measure asymmetry for each pixel in the measurement spot, and to determine from the pixel asymmetry measurements in associated pixels of each of the two measurement gratings an overlay value and a process dependent value, and a quality indicator for the overlay value and the process dependent value.

2. The lithographic apparatus according to claim 1, wherein the bias comprises a shift over a distance d, in which d is smaller than a period of the gratings.

3. The lithographic apparatus according to claim 1, wherein the pixel asymmetry measurements are given as $A_+ = K(OV+d)$ and $A_- = K(OV-d)$, respectively, $A_+$ being the asymmetry measurement for the first biased measurement grating, $A_-$ being the asymmetry measurement for the other biased measurement grating, K being a process dependent value, OV being the overlay value and d being the bias distance.

4. The lithographic apparatus according to claim 1, wherein the quality indicator comprises a statistical parameter value of the pixel asymmetry measurements.

5. The lithographic apparatus according to claim 1, wherein the measurement spot is arranged to coincide with the entire area of the reference grating.

6. The lithographic apparatus according to claim 1, wherein the quality indicator is determined for a plurality of measurement spots on the substrate.

7. The lithographic apparatus according to claim 1, wherein the overlay measurement device comprises a scatterometer for measuring asymmetry from a reflected spectrum of the gratings.

8. A device manufacturing method comprising transferring a pattern from a patterning device onto a substrate, comprising:

providing two reference gratings in the substrate and two measurement gratings on top of the reference gratings, the measurement gratings being similar to the reference gratings, and oppositely biased in a single direction relative to the respective reference gratings;

obtaining pixel data of a measurement spot in each of the two measurement grating structures;

measuring asymmetry for each pixel in the measurement spot; and determining from the pixel asymmetry measurements in associated pixels of each of the two measurement gratings an overlay value and a process dependent value, and a quality indicator for the overlay value and the process dependent value.

9. The device manufacturing method according to claim 8, wherein the opposite bias comprises a shift over a distance d, in which d is smaller than a period of the gratings.

10. The device manufacturing method according to claim 8, wherein the pixel asymmetry measurements are given as $A_+ = K(OV+d)$ and $A_- = K(OV-d)$, respectively, $A_+$ being the asymmetry measurement for the first biased measurement grating, $A_-$ being the asymmetry measurement for the other biased measurement grating, K being a process dependent value, OV being the overlay value and d being the bias distance.

11. The device manufacturing method according to claim 8, wherein the quality indicator comprises a statistical parameter value of the pixel asymmetry measurements.

12. The device manufacturing method according to claim 8, wherein the measurement spot coincides with the entire area of the reference grating.

13. The device manufacturing method according to claim 8, wherein the quality indicator is determined for a plurality of measurement spots on the substrate.

14. The device manufacturing method according to claim 8, wherein the asymmetry is measured from a reflected spectrum of the gratings using a scatterometer.

15. A device manufactured according to the method according to claim 8.

* * * * *